US012677436B2

(12) United States Patent
Morvan

(10) Patent No.: US 12,677,436 B2
(45) Date of Patent: Jul. 7, 2026

(54) ELECTRONIC COMPONENT BASED ON P-DOPED GALLIUM NITRIDE

(71) Applicant: COMMISSARIAT À L'ENERGIE ATOMIQUE ET AUX ENERGIES ALTERNATIVES, Paris (FR)

(72) Inventor: Erwan Morvan, Grenoble (FR)

(73) Assignee: COMMISSARIAT À L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 450 days.

(21) Appl. No.: 18/324,562

(22) Filed: May 26, 2023

(65) Prior Publication Data

US 2024/0088281 A1    Mar. 14, 2024

(30) Foreign Application Priority Data

May 30, 2022    (FR) ...................................... 2205158

(51) Int. Cl.
| | |
|---|---|
| *H10D 30/47* | (2025.01) |
| *H10D 30/01* | (2025.01) |
| *H10D 62/824* | (2025.01) |
| *H10D 62/85* | (2025.01) |
| *H10D 62/854* | (2025.01) |

(52) U.S. Cl.
CPC ......... *H10D 30/475* (2025.01); *H10D 30/015* (2025.01); *H10D 62/824* (2025.01); *H10D 62/8503* (2025.01); *H10D 62/854* (2025.01)

(58) Field of Classification Search
CPC ..................... H10D 30/47–485; H10D 30/015
See application file for complete search history.

(56) References Cited

U.S. PATENT DOCUMENTS

| | | | | |
|---|---|---|---|---|
| 4,771,324 A | * | 9/1988 | Odani | .................. H10D 62/221 |
| | | | | 257/E29.05 |
| 2014/0264379 A1 | * | 9/2014 | Kub | ...................... H01L 21/762 |
| | | | | 257/77 |
| 2014/0264449 A1 | | 9/2014 | Parsey, Jr. et al. | |
| 2015/0011080 A1 | * | 1/2015 | Agraffeil | ............. H01L 21/3245 |
| | | | | 438/530 |
| 2015/0372081 A1 | | 12/2015 | Lee et al. | |

(Continued)

FOREIGN PATENT DOCUMENTS

| | | |
|---|---|---|
| EP | 2 339 635 A2 | 6/2011 |
| EP | 3 203 526 A1 | 8/2017 |
| FR | 3 047 607 A1 | 8/2017 |

OTHER PUBLICATIONS

Search Report as issued in French Patent Application No. FR2205158, dated Mar. 30, 2023.

(Continued)

*Primary Examiner* — Christine S. Kim
*Assistant Examiner* — Cole Leon Lindsey
(74) *Attorney, Agent, or Firm* — CUSHMAN PARTNERS LLC

(57) ABSTRACT

An electronic component includes a substrate, an active stack formed above the substrate and including: a layer of p-type doped Gallium Nitride GaN, disposed above the substrate, and a layer of a semiconductor material disposed on the layer of p-type doped Gallium Nitride GaN; the component including two side zones located on either side of the layer of p-type doped GaN, the two side zones being oxygen-implanted.

18 Claims, 7 Drawing Sheets

(56) References Cited

U.S. PATENT DOCUMENTS

2017/0358495 A1 * 12/2017 Jiang .................... H10D 62/124
2020/0321432 A1 * 10/2020 Wei ...................... H10D 62/108

OTHER PUBLICATIONS

Kuwano, Y., et al., "Lateral Hydrogen Diffusion at p-GaN Layers in
Nitride-Based. Light Emitting Diodes with Tunnel Junctions," Japa-
nese Journal of Applied Physics 52, (Year: 2013), The Japan Society
of Applied Physics, 4 pages.

* cited by examiner

ELECTRONIC COMPONENT BASED ON P-DOPED GALLIUM NITRIDE

CROSS-REFERENCE TO RELATED APPLICATIONS

This application claims priority to French Patent Application No. 2205158, filed May 30, 2022, the entire content of which is incorporated herein by reference in its entirety.

TECHNICAL FIELD OF THE INVENTION

The present invention is directed to electronic components based on p-doped gallium nitride (GaN) and more particularly to GaN-based heterojunction power electronic components, such as high electron mobility transistors (HEMTs) and Schottky diodes.

TECHNOLOGICAL BACKGROUND OF THE INVENTION

Gallium nitride is currently a very popular material for making different electronic components. This is especially true of light-emitting diodes, Schottky diodes and so-called high electron mobility transistors (HEMTs). These components require the use of p- and n-doped semiconductors. Organometallic source epitaxy is the most widespread growth technique for obtaining these components. However, hydrogen is one of the most significant contaminants in semiconductors fabricated from organometallic precursors. One of the drawbacks associated with the presence of hydrogen is that it will neutralise acceptors when attempting to obtain a p-doped semiconductor. This neutralisation takes place through the formation of electrically inactive acceptor-hydrogen complexes, making it more difficult to obtain effective p-doping.

The problem discussed above of obtaining effective p-doping hampered by the presence of hydrogen is found especially in the production of GaN-based components such as HEMTs for both RF applications (amplification, LNA Low Noise Amplifier, switches, oscillators, etc.) and power applications (power transistors for energy conversion). A two-dimensional electron gas (or 2DEG) is formed under the interface between a barrier layer (for example of AlGaN, InAlN, InAlN, AlN, ScAlN, AlN, InAlGaN, etc.) and the channel (for example GaN). This 2DEG is connected at the source and drain by metallic ohmic contacts and is controlled by a gate (of the Schottky or MIS Metal-Insulator-Semiconductor type).

A heterojunction is formed by the junction of two semiconductor materials having different band gaps. For example, an AlGaN/GaN type heterojunction comprises a layer of gallium nitride (GaN) with a layer of aluminium gallium nitride (AlGaN) thereabove. The 2DEG forms under the interface between the AlGaN layer and the GaN layer as a result of spontaneous polarisation and piezoelectric polarisation. This two-dimensional electron gas serves as a conduction channel within heterojunction electronic components, such as HEMT transistors and Schottky diodes.

An AlGaN/GaN heterojunction electronic component is generally manufactured from a semiconductor substrate (for example of silicon, sapphire or SiC) by successively epitaxially growing a nucleation layer, one or more transition layers, a thick buffer layer and the heterojunction layers (GaN channel, and then AlGaN barrier). The buffer layer, several microns thick, limits lateral and vertical leakage currents in the component and better confines the two-dimensional electron gas of the heterojunction. The semi-insulating buffer layer is formed, for example, by carbon-doped GaN.

This type of component supports high current densities in the ON state, due to the high density of charge carriers (electrons) and the high mobility of these carriers in the two-dimensional electron gas. However, it suffers from a transient phenomenon known as on-state "current collapse". This phenomenon is related to charge trapping in the epitaxially grown structure, and more particularly in the carbon-doped GaN buffer layer. Traps become negatively charged when the component is in the OFF state and then deplete the two-dimensional electron gas back to the ON state, by capacitive coupling effect. The depletion of the two-dimensional electron gas leads to an increase in the dynamic resistance and the drain saturation current in the ON state of the component (and therefore a decrease in the current in the ON state).

Patent application FR3047607 describes an example of a heterojunction transistor structure that addresses this on-state current collapse problem.

With reference to FIG. 1, this first transistor structure comprises a substrate 11, at least one transition layer 12 disposed on the substrate 11, a buffer layer 13 (for example carbon-doped GaN) disposed on the transition layer 12, a p-doped GaN layer 14 disposed on the buffer layer 13, an n-doped GaN layer 15 disposed on the p-doped GaN layer 14, an unintentionally doped GaN layer 16 disposed on the n-doped GaN layer 15 and an AlGaN layer 17 disposed on the unintentionally doped GaN 16 layer. The unintentionally doped GaN layer 16 and the AlGaN layer 17 form the heterojunction. A two-dimensional electron gas is intrinsically formed under the interface between the unintentionally doped GaN layer 16 and the AlGaN layer 17. This two-dimensional electron gas is illustrated in FIG. 1 as a layer 18 disposed between layers 16 and 17.

The p-doped GaN layer 14 and the n-doped GaN layer 15 together form a particularly high potential barrier (depleted PN junction) under the electron gas layer 18. This potential barrier, also called a back barrier, improves confinement of the two-dimensional electron gas by reducing the number of electrons trapped in the buffer layer 13.

The transistor structure described in patent application FR3047607 makes it possible to limit the current collapse phenomenon but assumes the use of a p-doped GaN layer 14. This p-doping is obtained, for example, by Mg-based doping used as an acceptor. To be effective, the back barrier should have a maximum Mg activation rate. Otherwise, it is necessary to use a higher Mg concentration to achieve the target acceptor concentration, which leads to a higher Mg concentration in the channel to the 2DEG gas and degrades electronic transport properties in the channel. However, as has been seen above, the presence of hydrogen, especially of organometallic origin, limits Mg activation.

One known solution to this problem of activating acceptors, in this case Mg atoms, is to anneal them under oxygen to avoid creating complexes between hydrogen and magnesium. However, this solution is not ideal in the case of the HEMT transistor of FIG. 1, because the p-doped GaN layer 14 lies beneath a series of layers formed by the n-doped GaN layer 15, the unintentionally doped GaN layer 16 and the AlGaN layer 17. Thus, the fact that the GaN p layer 14 is covered prevents exo-diffusion of hydrogen, which remains present in the GaN p layer 14. It is the configuration of the electric field in the upper layers that prevents exo-diffusion of hydrogen.

This difficulty is found in other electronic components using p-doped GaN such as light-emitting diodes or some power components where the use of a buried p layer makes it possible to obtain a positive threshold voltage. Here too it is important to optimise activation of Mg atoms.

A known solution to the above problem has been provided for applications in optoelectronics (the case of light-emitting diodes) in document "Lateral Hydrogen Diffusion at p-GaN Layers in Nitride-Based Light Emitting Diodes with Tunnel Junctions". Yuka Kuwano et al, Japanese Journal of Applied Physics 52 (2013) 08JK12 08JK12-1 #2013 The Japan Society of Applied Physics. This solution is illustrated in FIGS. 2a and 2b. FIG. 2a shows a conventional stack of a light-emitting diode with a buried GaN-p layer. According to FIG. 2b, hydrogen responsible for the low Mg activation rate is discharged through the flanks of the component. The III-N semiconductor stack is etched around the component and annealing in an oxygen-containing atmosphere enables the hydrogen to be diffused and discharged over a distance in the order of a few tens of microns, thereby improving Mg activation.

However, this solution is not satisfactory for all GaN-p-based components. Thus, for a transistor, etching can lead to integration problems (topology) and parasitic currents. In addition, the dimensions of a transistor are often greater than the hydrogen diffusion length and it is difficult to contemplate etching within the transistor. This approach is therefore especially unsuitable for manufacturing transistors. More generally, etching to obtain mesas makes the method for manufacturing an electronic component more complex.

SUMMARY OF THE INVENTION

There is therefore a need to provide a p-doped gallium nitride-based electronic component with satisfactory activation of the acceptors responsible for p-doping, without degrading performance of the component and easy to manufacture, especially when said electronic component is a HEMT-type transistor.

To this end, the object of the invention is an electronic component comprising:
   a substrate;
   a p-type doped Gallium Nitride GaN layer, disposed above the substrate;
   a semiconductor material layer disposed on the p-type doped Gallium Nitride layer;
the component including two side zones located on either side of the p-type doped GaN layer, the two side zones being oxygen-implanted.

By oxygen-implanted side zone, it is meant a zone in which a large proportion of oxygen is available to form covalent bonds with hydrogen. In other words, this oxygen-implanted zone is not an oxygen doped zone because in this case the majority of oxygen present would be in a substitutional site in the GaN crystal lattice. The oxygen-implanted zone should therefore be seen as a zone that underwent an oxygen atom implantation step and heat annealing but has not been subjected to a thermal budget sufficient for the oxygen to include itself as a donor and form an n-doped GaN zone. Instead, the oxygen is randomly distributed within the crystal lattice and mainly in interstitial positions. After implantation, there is also a large amount of crystalline defects in the matrix (each implanted oxygen atom moves several hundred atoms in the matrix).

The invention is based on the creation of oxygen pockets (i.e. side zones) in zones located on either side of the GaN zone where effective activation of the acceptors is sought.

These oxygen pockets in proximity to the doped zone and therefore to atoms likely to play the role of acceptors (for example magnesium Mg in GaN) allow hydrogen, under the effect of post-implantation annealing, to diffuse towards these pockets and react with oxygen implanted in such a way as to reduce formation of hydrogen-acceptor complexes. Unlike solutions in the state of the art, the component according to the invention does not require etching around the p-type layer. The side zones can be easily produced by starting from the p-doped GaN layer in which oxygen is implanted on its side zones; in other words, the side zones are in the same plane as the GaN-p layer and form the end parts of this layer.

The component according to the invention may also have one or more of the characteristics below, considered individually or according to any technically possible combinations:
   The acceptors of the p-type doped Gallium Nitride GaN layer are Magnesium atoms.
   The width of the active stack and the width of each of the oxygen-implanted zones are less than or equal to 20 μm and greater than or equal to 1 μm, the width being measured parallel to the plane of the layers in line with the stack and the oxygen-implanted zones.
   The active stack includes:
      an n-type doped GaN layer deposited onto the p-type doped GaN layer;
      an unintentionally doped GaN layer deposited onto the n-type doped GaN layer; and
      a semiconductor layer deposited onto the unintentionally doped GaN layer to form a two-dimensional electron gas;
   the component including a source zone, a drain zone and a control gate zone formed on or in the semiconductor layer to form a two-dimensional electron gas, the two oxygen-implanted side zones also extending on either side of the n-type doped GaN layer, the unintentionally doped GaN layer and the semiconductor layer to form a two-dimensional electron gas.
   The electronic component includes:
      a plurality of active stacks, each active stack including:
      an n-type doped GaN layer deposited onto the p-type doped GaN layer;
      an unintentionally doped GaN layer deposited onto the n-type doped GaN layer;
      a semiconductor layer deposited onto the unintentionally doped GaN layer to form a two-dimensional electron gas;
      two oxygen-implanted side zones extending on either side of the p-doped GaN layer, the n-doped GaN layer, the unintentionally doped GaN layer and the semiconductor layer to form a two-dimensional electron gas
   the source, drain and control gate zones being common to the plurality of stacks, each stack being electrically insulated from the adjacent stack by one of the side oxygen-implanted zones.
      all said stacks are surrounded by a so-called insulation zone, said insulation zone being an oxygen-implanted zone.
      According to one embodiment, each of the two oxygen-implanted side zones extends into or under the gate zone and into or under the drain zone and the source zone;

According to another embodiment, each of the two oxygen-implanted side zones extends in or under the gate zone and does not extend in or under the drain zone and the source zone.

Another object of the invention is a method for manufacturing a component according to the invention including the following steps of:

Making on a substrate a stack formed above the substrate and including:

a p-type doped Gallium Nitride GaN layer, disposed above the substrate;

a layer of a semiconductor material disposed on the semiconductor material layer;

Making a mask above the stack, said mask masking the part of the stack forming the active stack;

Ion implantation to introduce oxygen atoms into the two zones of the stack located on either side of the masked zone so as to obtain two side zones in the p-type doped Gallium Nitride GaN layer oxygen-implanted;

Annealing following ion implantation.

The method according to the invention may also have one or more of the characteristics below, considered individually or according to any technically possible combinations:

the annealing temperature is between 700 and 850° C.

the implantation is a multi-energy implantation.

the energy of the oxygen atoms ionised used for implantation is less than or equal to 200 keV.

the dose of oxygen atoms implanted is:

greater than $2 \cdot 10^{14}$ cm$^{-2}$×(Wa/Wo) where Wa denotes the width of the active stack and Wo denotes the width of the side zones implanted and;

less than $6 \cdot 10^{15}$ cm$^{-2}$×(Wa/Wo).

the ion implantation step for introducing oxygen atoms is accompanied with an ion implantation step for introducing argon or nitrogen atoms.

The invention and its different applications will be better understood upon reading the following description and upon examining the accompanying figures.

BRIEF DESCRIPTION OF THE FIGURES

The figures are set forth by way of indicating and in no way limiting purposes of the invention.

DETAILED DESCRIPTION

Figure 1:
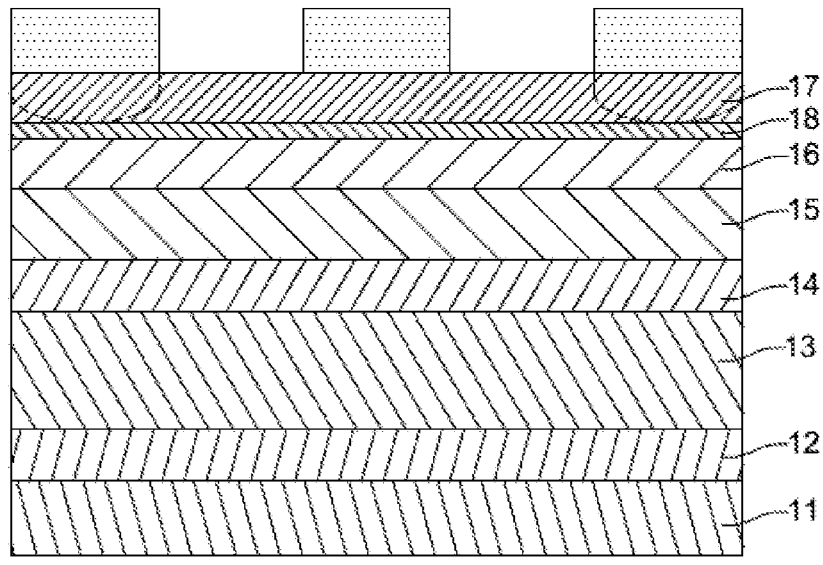
FIG. 1 represents an example of a heterojunction transistor according to prior art.
Figures 2A, 2B:
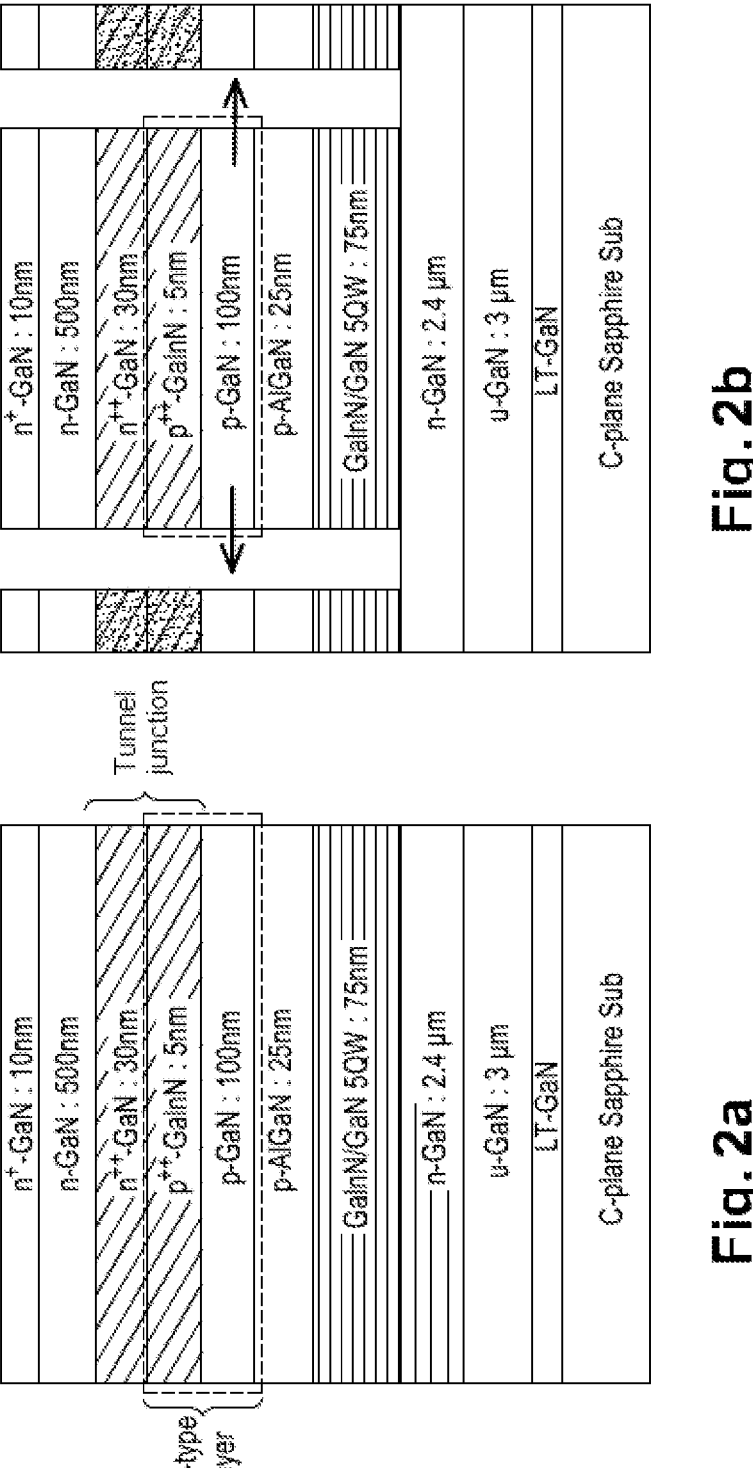
FIGS. 2a and 2b represent a magnesium activation solution in an optoelectronic component according to prior art.
Figures 3, 4:
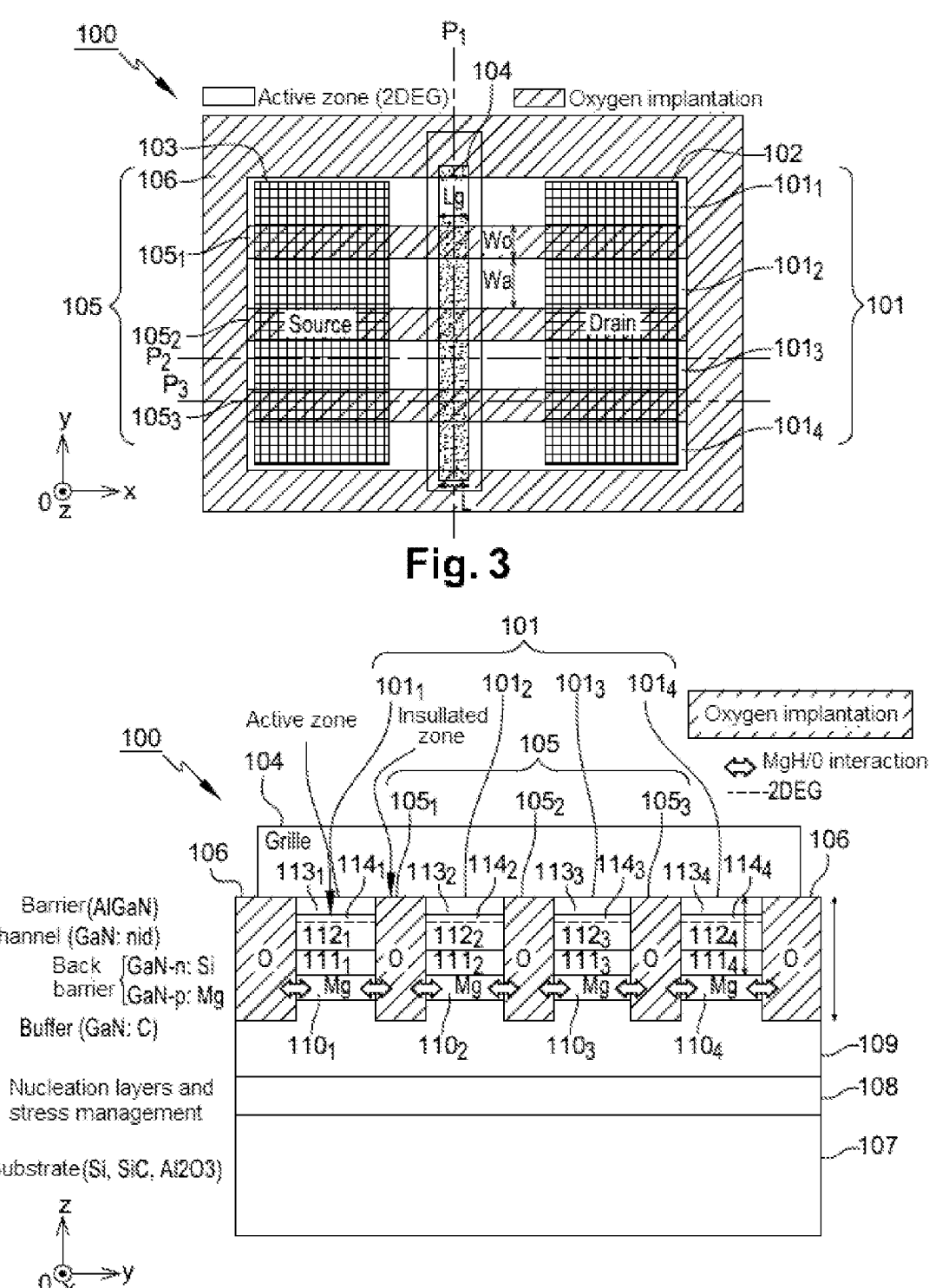
FIG. 3 represents a top view of an electronic component according to a first embodiment of the invention.
FIG. 4 represents a cross-section view of the component of FIG. 3 in a plane perpendicular to the plane of the layers and along the gate finger.

FIG. 3 represents a top view of an electronic component 100 according to the invention in a plane Oxy. According to this embodiment, the electronic component 100 is a high electron mobility transistor (HEMT). The transistor 100 includes:

An active zone 101 including a plurality of elementary active zones 101$i$ (i here ranging from 1 to 4);

A drain zone 102;

A source zone 103;

A gate zone 104;

An oxygen-implanted zone 105 including:

a peripheral insulation zone 106;

a plurality of elementary oxygen-implanted zones 105$j$ (here j ranging from 1 to 3) arranged between each elementary active zone 101$i$.

It is appropriate to note that the numbers i=4 of elementary active zones and j=3 of elementary oxygen-implanted zones are given here purely by way of illustration and that these numbers may vary depending on the intended applications.

As will be seen later, the assembly formed by the elementary active zones 101$i$ and the oxygen-implanted zones 105$j$ is made from a one and a single stack of epitaxially grown layers, some of the zones of which have undergone oxygen implantation and heat annealing, the heat annealing being applied to the entire wafer.

The active elementary 101$i$ and oxygen-implanted 105$j$ zones are successively arranged in the form of parallel strips along the direction Ox so that an active elementary zone 101$i$ is either surrounded by two oxygen-implanted elementary zones 105$_j$ and 105$_{j+1}$ (in the case of active elementary zones 101$_2$ and 101$_3$) or by an elementary zone and the peripheral insulation zone 106 (in the case of active elementary zones 101$_1$ and 101$_4$).

The gate zone (also called gate finger) 104 is arranged between the source zone 103 and the drain zone 102 along the axis Oy perpendicular to the axis Ox along which the elementary active zones 101$i$ and the elementary oxygen-implanted zones 105$j$ extend. According to the invention, the source, drain and gate zones are common to all the elementary active zones 101$i$ (i.e. there is a single source zone, a single drain zone and a single gate zone for the plurality of elementary active zones 101$i$). In other words, the single gate zone controls all the elementary active zones.

According to this embodiment, the source 103 and drain 102 zones are both in contact (surface contact or contact buried in the zones) with the active zones 101$i$ but also with the elementary oxygen-implanted zones 105$j$.

According to the invention, the gate finger 104 is in contact (surface contact or via a dielectric layer, or buried in the AlGaN layer) both with the active zones 101$i$ and with the elementary oxygen-implanted zones 105$j$.

In the remainder of the description, Wa will designate the width of each active zone 101$i$ measured in the direction Oy and Wo is the width of each elementary oxygen-implanted zone 105$j$, also along the direction Oy. Also, Lg will designate the gate length measured according to the axis Ox. By convention, the "length" (L) corresponds to the transverse dimension (Lg, . . . ) and the "width" (W) corresponds to the development of the transistor in the direction perpendicular to the plane of the transverse cross-sections.

FIG. 4 shows a cross-section view of component 100, the cross-section being made in a plane P1 parallel to the plane Oyz and passing through the gate zone 104. The plane of the different layers is parallel to the plane Oxy of FIG. 3.

Component 100 includes a substrate 107. The substrate 107 is, for example, made of (intrinsic or doped) silicon, silicon carbide (SiC) or sapphire, onto which a transition layer 108 is deposited, acting as a nucleation layer and for lattice matching in parameters between the substrate 107 and the subsequent GaN buffer layer 109. The transition layer 108 makes it possible to manage mechanical stresses between the substrate 107 and the layers formed by epitaxy. The layer 108 can include the superposition of a nucleation layer (typically of AlN) and several lattice match layers (for example several layers of AlGaN with a decreasing molar fraction of AlN, or a superlattice comprising several AlxGa (1-x)N/GaN bilayers). Such an intermediate layer 108 is particularly advantageous in the event of a strong lattice mismatch in parameters between the GaN layer deposited above and the substrate 107, which could lead to a prohibitive level of mechanical dislocations in these layers. In order not to make the figures unnecessarily cumbersome, this transition layer 108 will not be represented in the other figures.

The component 100 includes a buffer layer 109 deposited onto the transition layer 108. The buffer layer 109 can have a thickness that depends on the target voltage for the transistor 100. A relatively large thickness of the buffer layer 109 makes it possible to limit lateral and vertical leakage currents in the transistor 100 and also to better confine the electron gas layer that will be described later. The buffer layer 109 can, for example, be made of carbon-doped GaN—Si (semi-insulator) or of a superimposed GaN—SI/ AlxGa(1-x)N layer with low x, for example between 4 and 8%.

The active zones 101$i$ are for example formed by a stack including successively:

a p-doped GaN layer 110$i$ disposed on the buffer layer 109, an n-doped GaN layer 111$i$ disposed on the p-doped GaN layer 110$i$, an unintentionally doped GaN layer (channel) 112$i$ disposed on the n-doped GaN layer 111$i$ and, an AlGaN layer (barrier) 113$i$ disposed on the unintentionally doped GaN layer 112$i$.

It should be noted that there may also be a "spacer" between the channel and the barrier, in the form of a very thin AlN layer (0.5 to 2 nm) which makes it possible to improve density and transport properties in the 2DEG.

For each elementary stack 101$i$, the unintentionally doped GaN layer 112$i$ and the AlGaN layer 113$i$ form a heterojunction such that a two-dimensional electron gas 114$i$ is intrinsically formed under the interface between the unintentionally doped GaN layer and the AlGaN layer. The AlGaN layers 113$i$ may be covered with a passivation layer not represented in FIG. 4, for example of silicon dioxide (SiO$_2$), silicon nitride (Si$_3$N$_4$), aluminium nitride (AlN), gallium nitride (GaN) or alumina (Al$_2$O$_3$). This passivation layer serves to control the surface of the AlGaN layer.

The p-doped GaN layer 110$i$ and the n-doped GaN layer 111$i$ together form a particularly high potential barrier (depleted PN junction) under the electron gas layer 114$i$.

Advantageously, the p doping of the 111$i$ layer is carried out with Magnesium and the n doping of the 112$i$ layer is carried out with Silicon.

An oxygen-implanted zone is located on either side of each active stack 101$i$. This may be either part of the peripheral zone 106 or an elementary zone 105$j$. Thus, according to the invention, two oxygen-implanted side zones are arranged on either side of each p-doped GaN layer 110$i$. In the embodiment illustrated in FIGS. 3 and 4, two oxygen-implanted side zones, 106 or 105$j$, are arranged on either side of the entire stack 101$i$. The interest of these oxygen-implanted side zones will be explained in greater detail below.

Figure 5:
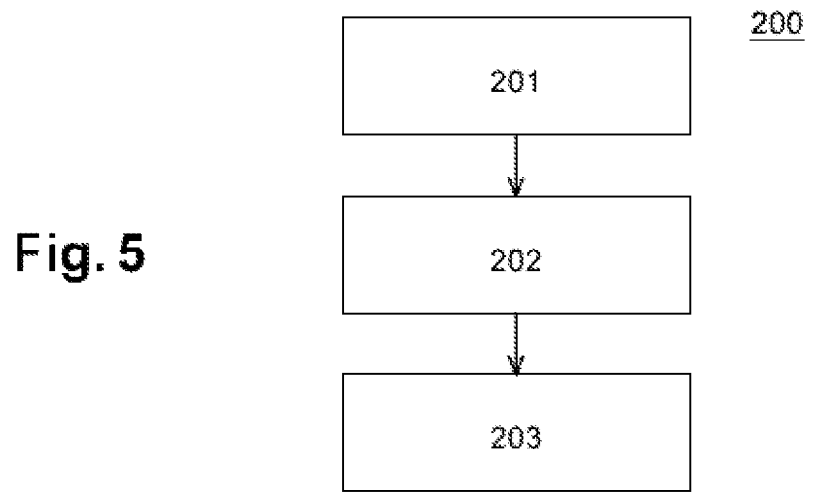
FIGS. 5 to 8 represent schematically the steps in the method for manufacturing a component according to the invention.
Figure 7:
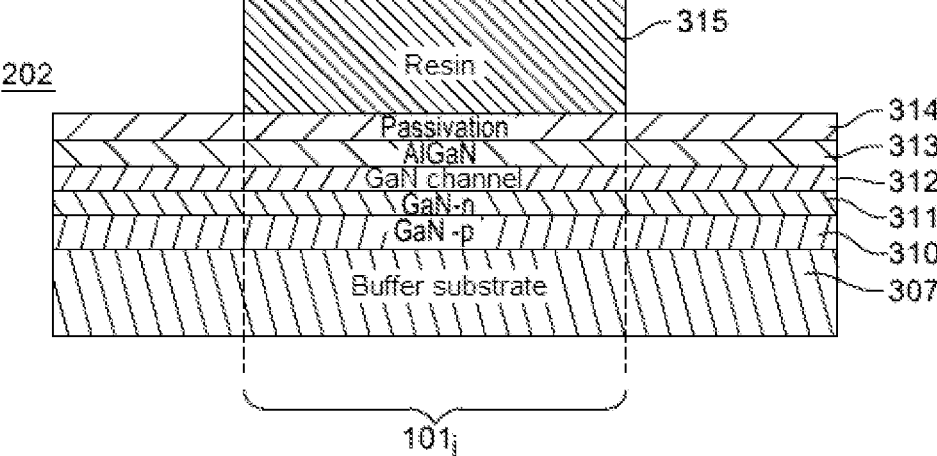
Figure 8:
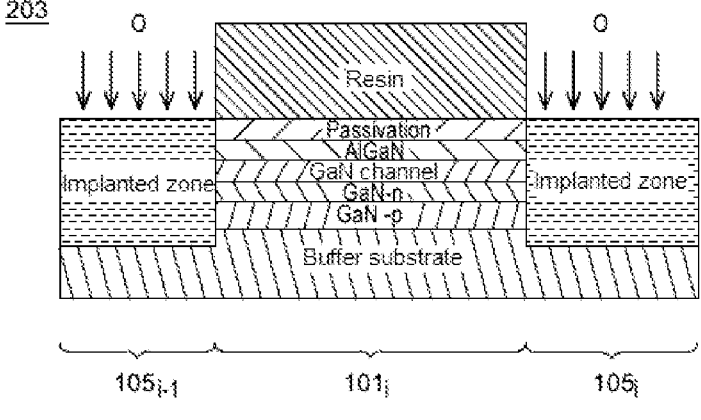

According to the invention, the active zone 101 and the oxygen-implanted zone 105 are made from one and a single stack of layers. A method 200 for making a component including the active zone 101 and the oxygen-implanted zone 105 including the peripheral zone and the plurality of elementary implanted zones is illustrated in FIGS. 6 to 8 as well as in FIG. 5 representing the different steps of this method 200.

Figure 6:
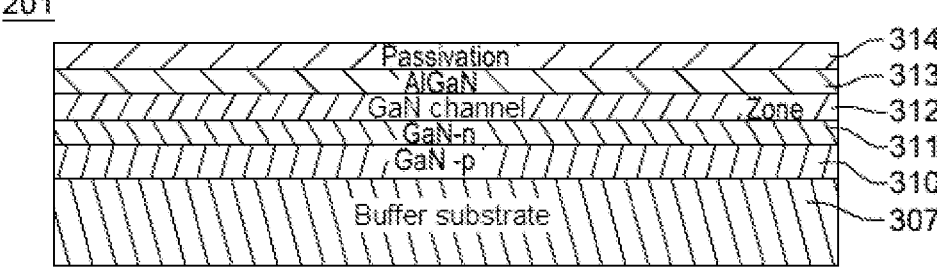

The first step 201 consists in depositing onto a substrate 307 the desired stack, namely in the example of FIG. 6, a stack including:

a p-doped GaN layer 310, an n-doped GaN layer 311 disposed on the p-doped GaN layer, an unintentionally doped GaN layer 312 disposed on the n-doped GaN layer, an AlGaN layer 313 disposed on the unintentionally doped GaN layer, a passivation layer 314.

This stack is obtained by epitaxy techniques known to the person skilled in the art, for example by metalorganic vapour phase epitaxy (MOCVD). It should be noted that the transition and buffer layers have been deliberately omitted from FIGS. 6 to 8.

The method 200 then includes a step 202 of masking the zones intended to form the elementary active zones of the component. A mask 315 made of photosensitive resin is thus represented in FIG. 7. This masking step is carried out using photolithography techniques well known to those skilled in the art. The mask 315 serves here, for example, to delimit one of the elementary active zones 101$i$.

The method 200 then includes a step 203 of ion implantation with oxygen atoms in the zones not protected by the resin, said implantation being intended to form the elementary oxygen-implanted zones and the peripheral insulation oxygen-implanted zone. The implantation step is followed by a resin removal step, for example by stripping. The resin removal step is followed by a heat annealing step at a temperature of about 800° C. (between 700° C. and 850° C.) for 1 to 30 minutes. The time required for lateral diffusion of hydrogen depends on the temperature and the size W of the active zones.

The method 200 according to the invention thus makes it possible to make the entire oxygen-implanted zone 105 represented in FIGS. 3 and 4, including the peripheral insulation zone 106 and the plurality of elementary oxygen-implanted zones 105$j$ arranged between each elementary active zone 101$i$.

The oxygen-implanted zones should therefore be seen as zones that have undergone oxygen implantation and heat annealing, thus creating pockets implanted both around the component to insulate it and also within the component to improve activation of the acceptor (here Mg) of each layer 110$i$ of the back barrier. Indeed, there are two side zones 105$i$ on either side of each p-doped GaN layer 110$i$ and also on either side of the 2DEG gas 114$i$. Oxygen implantation leads to the formation of deep levels (associated with implantation defects) in the gap of the GaN semiconductor that completely neutralise the 2DEG at the place of implantation. In this zone, the transistor is thus not active, which ensures insulation. Post-implantation annealing further allows hydrogen, which passivates Mg dopant, to diffuse and react with the oxygen implanted. As the Hydrogen diffusion distance is limited, it is necessary to split the pockets of Oxygen in the active zone (FIGS. 3 and 4). Each Oxygen elementary zone 105i having width Wo will interact with the active parts 101i having width Wa which are close thereto.

Advantageously, the width of the elementary active zones Wa and of the Oxygen-implanted elementary zones Wo are at most 20 μm to allow effective interaction between Oxygen atoms and Hydrogen atoms. They are at least 1 μm in order to avoid the complete neutralisation of the 2DEG by the lateral dispersion of the Oxygen implantation in the active zones and to respect masking restrictions of the implantation step. Within this window of between 1 μm and 20 μm, the choice of Wo and the active zone ratio Wa/(Wa+Wo) is free and is dictated by the performance objective of the transistor in terms of frequency, heat resistance and access resistances.

Figure 12:
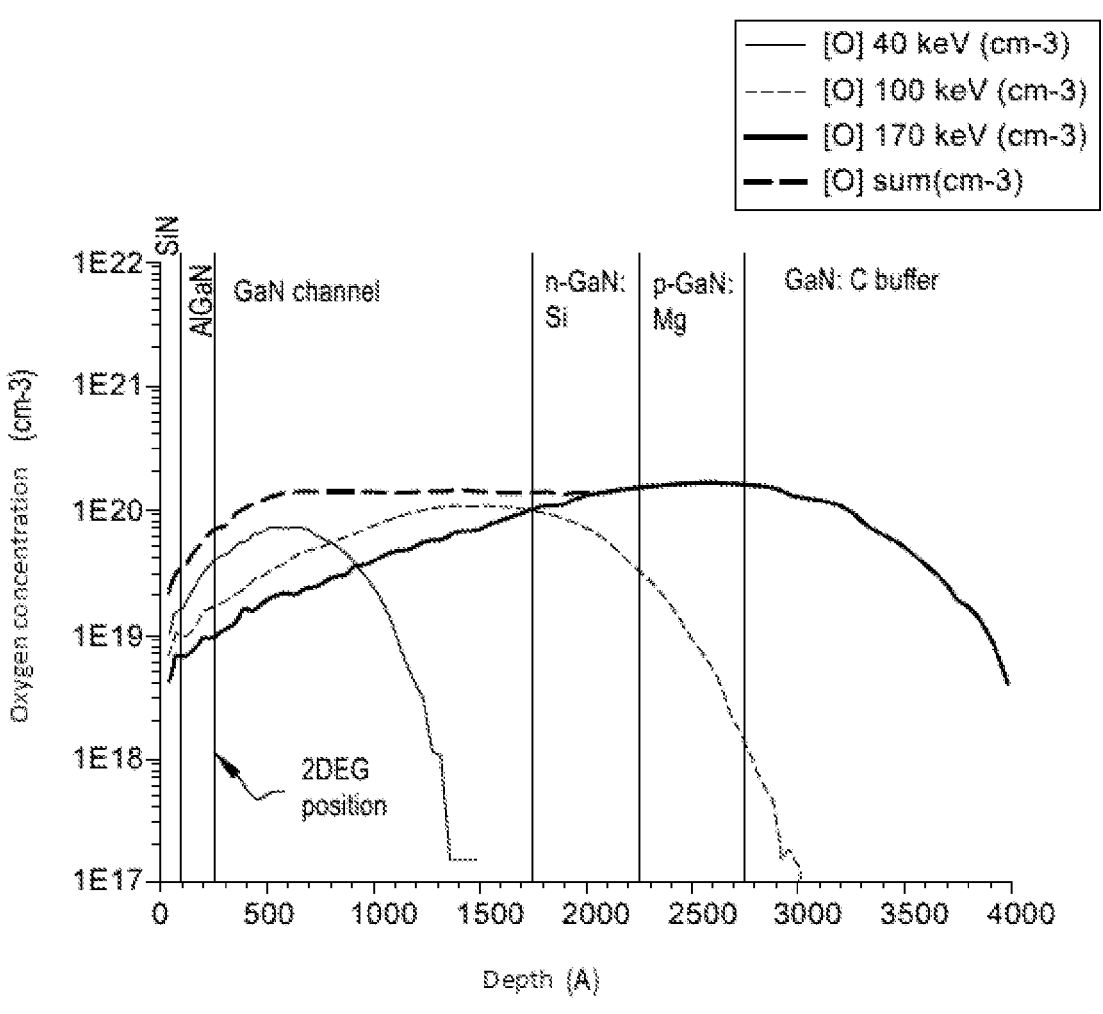
FIG. 12 represents an example of an oxygen implantation profile used to produce components according to the invention.

The oxygen implantation step should be carried out so that the oxygen is present in the depth of the stack and especially at the 2DEG gas and the p-doped GaN layer. To achieve this, advantageously several implantation energies will be used which make it possible both to neutralise the 2DEG (insulation) and to interact with the buried Mg doped layer. It is also advantageous to use a multi-energy implantation to distribute the oxygen dose at depth. The thickness of the Oxygen-implanted zone is denoted t. It should be greater than or equal to the depth of the p-doped GaN layer (Mg). As the latter is in the order of 150 nm, a maximum energy of 150-200 keV is sufficient and achievable with an implantation frame conventionally used in a CMOS-type clean room. It is known to the person skilled in the art to choose a sequence of energies and doses enabling an approximately flat oxygen profile to be obtained at the target oxygen concentration. One example of such a profile is given in FIG. 12. This Oxygen implantation profile is obtained by triple implantation (40 keV with an implantation dose of $5 \cdot 10^{14}$ cm$^{-2}$, 80 keV with an implantation dose of $10^{15}$ cm$^{-2}$ and 170 keV with an implantation dose of $3 \cdot 10^{15}$ cm$^{-2}$). The oxygen concentration is high (i.e. greater than $10^{20}$ cm$^{-3}$) around the Mg-doped p GaN layer 110i. The defects generated by the three implantations are sufficient to neutralise the 2DEG gas at the interface 114i between the AlGaN layer 112i and the unintentionally doped GaN layer 113i. Regarding the Oxygen implantation dose, $\phi_{Oxygen}$ which can be considered to be approximately equal to [O]×t, where [O] is the oxygen concentration and t is the thickness of the Oxygen-implanted zone, it is:

sufficient to capture Hydrogen in the p-doped GaN layer; typically, a $\phi_{Oxygen}$ dose>$2 \cdot 10^{14}$ cm$^{-2}$×(Wa/Wo) will be sought. This corresponds, for example, to an [O]concentration>$1 \cdot 10^{19}$ cm$^{-3}$ if t=200 nm and Wa=Wo;

limited, in order to avoid deformations of the substrate and to facilitate integration of this step into the transistor manufacture steps; typically, a $\phi_{oxygen}$ dose<6e15 cm$^{-2}$×(Wa/Wo) will be sought. This corresponds to an [O]concentration<$3 \cdot 10^{20}$ cm$^{-3}$ if t=200 nm and Wa=Wo. Such a dose range is also sufficient to insulate the transistor from the 2DEG gas.

As mentioned previously, the oxygen-implanted zone is not an oxygen-doped zone because in this case the majority of oxygen present would be in a substitutional site in the GaN crystal lattice and oxygen would then not be available to capture hydrogen, preventing p-doping in the GaN by the creation of Mg—H complexes. Thus, the oxygen-implanted zone should be seen as a zone that underwent an oxygen atom implantation step followed by annealing but has not been subjected to a thermal budget sufficient for the oxygen to behave as a donor and form an n-doped GaN zone. However, in order to more safely prevent oxygen from acting as a dopant (i.e. donor) in the implanted GaN, the oxygen implantation step 203 can be a co-implantation step during which both oxygen and Argon Ar or nitrogen N are implanted. This ensures that no residual n-type doping appears and does not degrade the high resistivity of the implanted zone.

In addition to the role of activator of the p-doping in the GaN layer of the back barrier and insulator of the 2DEG gas of the transistor, the use of oxygen-implanted side zones 105j makes it possible to split the active power zones 101i (see top view in FIG. 3). The active zones of a power transistor are in fact localised heat sources whose extension is Wg×L, where Wg is the development of the gate and L is the length of the heat source (which may be greater than Lg) measured along the axis Ox, L being equal to 0.5 μm for example. Wg corresponds to the gate width, measured along the axis Oy facing the active zone. By splitting the transistor's active zone into unitary heat sources Wa, spaced apart by Wo, thermal coupling between these sources is limited. This reduces the thermal resistance thereof.

Figure 9:
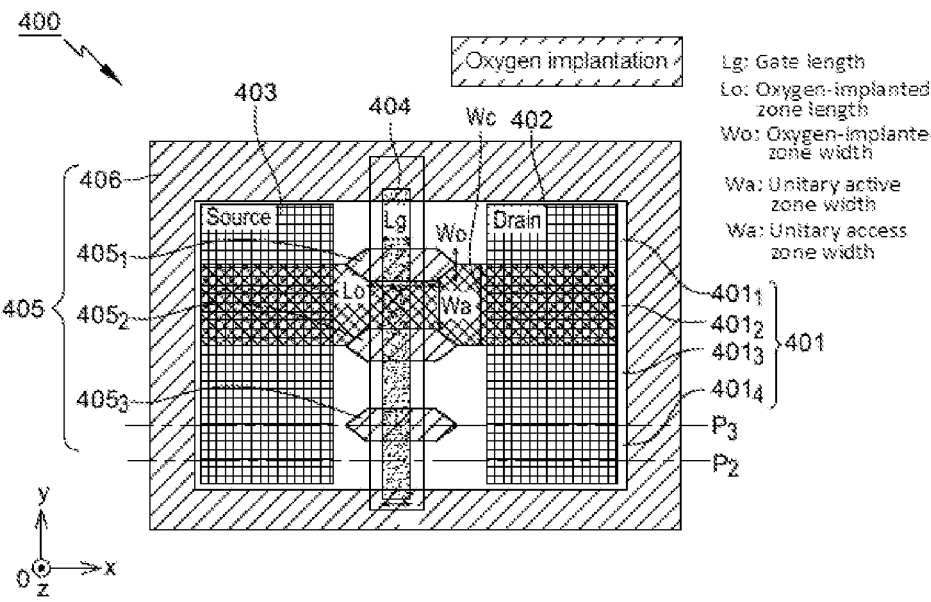
FIG. 9 represents a top view of an electronic component according to a second embodiment of the invention.

FIG. 9 represents one alternative to the transistor according to the invention represented in FIG. 3. As in the case of FIG. 3, FIG. 9 represents a top view of a HEMT transistor 400 according to the invention in a plane Oxy. Like transistor 100, transistor 400 includes:

An active zone 401 including a plurality of elementary active zones 401i;

A drain zone 402;

A source zone 403;

A gate zone 404;

An oxygen-implanted zone 405 including:

a peripheral insulation zone 406;

a plurality of elementary oxygen-implanted zones 405j arranged between each elementary active zone 401i.

The active, drain, source and gate zones and the peripheral insulation zone are identical to the corresponding zones in FIG. 3.

On the other hand, this alternative of the invention consists in implanting the oxygen only in the gate zone but not as far as the source and drain zones. In other words, the elementary oxygen-implanted zones 405j are arranged so as to be under the gate zone but not to be present at the drain and source zones. The method for manufacturing the oxygen-implanted zones is the same as in FIG. 5, the difference being in the shape of the resin pattern intended to cover the non-implanted zones. According to the alternative in FIG. 9, the width Wc of the elementary source and drain access zones is greater than in the case of the transistor in FIG. 3, where the width of the source and drain access zones was equal to the width of the active zone Wa. Furthermore, the access resistances (source and drain) are lower due to the absence of the highly resistive implanted zones on the drain and source sides. Such an embodiment therefore increases performance of the transistor. The shape of the Oxygen implanted zone should be sufficiently wide around the gate (Wo) and reduce progressively towards the source and drain accesses. Of course, the surface area of each elementary oxygen-implanted zone should be large enough to ensure a sufficient amount of oxygen and to allow activation of the p-type dopants of the GaN layer at the gate: in fact, the back barrier should be particularly effective at the gate (hence the importance of observing the hydrogen neutralisation phenomenon in proximity to the gate, at the place where the 2DEG electrons have maximum energy).

In a known manner, the source and drain zones are either in direct contact with the AlGaN layer or buried ("recess") in the AlGaN layer and partially in the unintentionally doped GaN layer. Likewise, the gate zone can be a Schottky (metal-semiconductor junction) gate, a gate slightly buried in the stack of semiconductor layers or a MIS (Metal Insulator Semiconductor) gate. Thus, the elementary oxygen-implanted side zones can be under the gate zone (in the case of a Schottky or MIS contact) or be directly in contact with the gate zone (in the case of a gate buried in the elementary oxygen-implanted side zones). Likewise, according to the embodiment of FIG. 3, the elementary oxygen-implanted side zones may be under the source and drain zones (case of a direct contact with the AlGaN layer) or be directly in contact with the source and drain zones (case of a drain or source zone buried in the AlGaN layer and partially in the unintentionally doped GaN layer).

Figures 10A, 10B, 11A, 11B:
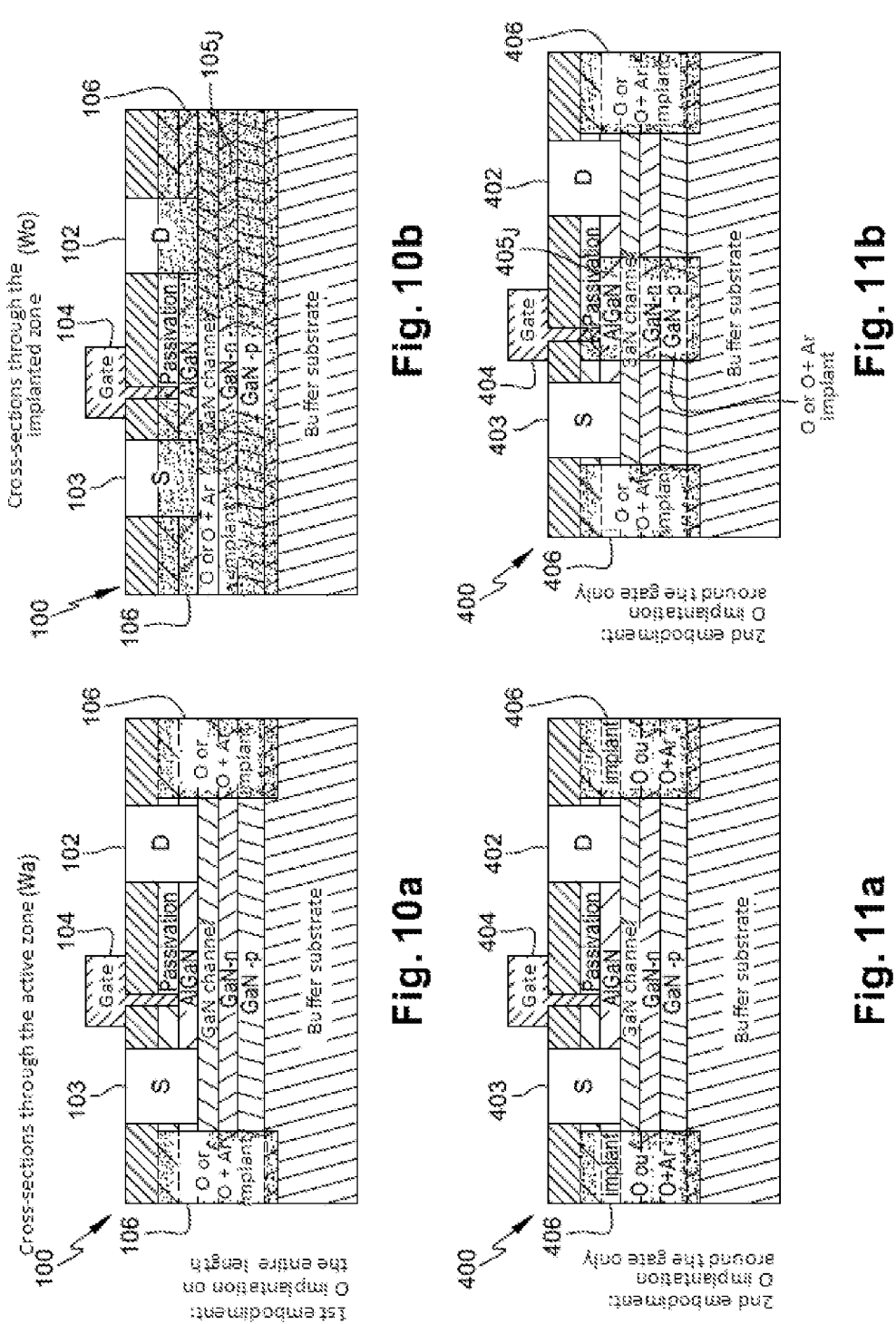
FIGS. 10a and 10b represent two cross-section views of the component of FIG. 3.
FIGS. 11a and 11b represent two cross-section views of the component of FIG. 9.

The presence of oxygen-implanted zones according to whether the component according to the invention is that of FIG. 3 or that of FIG. 9 is illustrated by FIGS. 10*a* and 10*b* (embodiment of FIG. 3) and by FIGS. 11*a* and 11*b* (embodiment of FIG. 9) respectively.

With reference to FIG. 3, FIG. 10*a* shows a cross-section of the device 100 in a plane P2 parallel to the plane Oxz and passing through an active zone 101*i*. FIG. 10*b* shows a cross-section of the device 100 in a plane P3 parallel to the plane Oxz and passing through an elementary oxygen-implanted zone 105*j*. It will be noted here that the source and drain zones 103 and 102 are buried, while the gate zone is in contact with the AlGaN layer. It is noticed here that the elementary oxygen-implanted zones 105*j* (see FIG. 10*b*) are at the gate zone 104 and that they extend at the source 103 and drain 102 zones. FIGS. 10*a* and 10*b* show the oxygen-implanted peripheral zone 106 insulating the component along its perimeter.

With reference to FIG. 9, FIG. 11*a* shows a cross-section of the device 400 in a plane P2 parallel to the plane Oxz and passing through an active zone 401*i*. FIG. 10*b* shows a cross-section of the device 400 in a plane P3 parallel to the plane Oxz and passing through an elementary oxygen-implanted zone 405*j*. It is noticed here that the elementary oxygen-implanted zones 405*j* (see FIG. 11*b*) are only at the gate zone 404 and that they do not extend to the source 403 and drain 402 zones. FIGS. 11*a* and 11*b* show the peripheral oxygen-implanted zone 406 insulating the component along its perimeter.

Of course, the invention is not limited to the embodiments just described. Thus, even if the embodiments described relate to HEMT transistors, the invention also applies to other electronic, especially optoelectronic, components, provided that the latter include at least one p-doped GaN layer covered with another semiconductor layer preventing exo-diffusion of hydrogen.

The invention claimed is:

1. An electronic component comprising:
a substrate
a plurality of active stacks, each active stack being formed above the substrate and including:
a layer of p-type doped Gallium Nitride GaN disposed above the substrate;
a layer of a semiconductor material disposed on the layer of p-type doped Gallium Nitride GaN;
wherein the electronic component includes two side zones located on either side of the respective p-type doped GaN layer of each active stack, the two side zones being oxygen-implanted,
wherein acceptors of the p-type doped Gallium Nitride GaN layer are Magnesium atoms, and
wherein a width of each active stack and a width of each of the oxygen-implanted zones are less than or equal to 20 μm and greater than or equal to 1 μm, the width being measured parallel to the plane of the layers in line with each active stack and the oxygen-implanted zones.

2. The electronic component according to claim 1, wherein each active stack includes:
an n-type doped GaN layer disposed on the p-type doped GaN layer;
an unintentionally doped GaN layer disposed on the n-type doped GaN layer; and
a semiconductor layer disposed on the unintentionally doped GaN layer to form a two-dimensional electron gas;
the component further including a source zone, a drain zone and a control gate zone formed on or in the semiconductor layer to form a two-dimensional electron gas.

3. The electronic component according to claim 2, wherein
each active stack includes:
an n-type doped GaN layer disposed on the p-type doped GaN layer;
an unintentionally doped GaN layer disposed on the n-type doped GaN layer;
a semiconductor layer disposed on the unintentionally doped GaN layer to form a two-dimensional electron gas;
two oxygen-implanted side zones extending on either side of the p-type doped GaN layer, of the n-type doped GaN layer, of the unintentionally doped GaN layer and of the semiconductor layer to form a two-dimensional electron gas,
the source, drain and control gate zones being common to the plurality of active stacks;
each active stack being electrically insulated from the adjacent active stack by one of the oxygen-implanted side zones.

4. The electronic component according to claim 3, wherein the plurality of said stacks is surrounded by an insulation zone, said insulation zone being an oxygen-implanted zone.

5. The electronic component according to claim 2, wherein each of the two oxygen-implanted side zones extends in or under the gate zone and in or under the drain zone and the source zone.

6. The electronic component according to claim 2, wherein each of the two oxygen-implanted side zones extends in or under the gate zone and does not extend in or under the drain zone and the source zone.

7. An electronic component comprising:
a substrate
a plurality of active stacks, each active stack being formed above the substrate and including:
a layer of p-type doped Gallium Nitride GaN disposed above the substrate;
a layer of a semiconductor material disposed on the layer of p-type doped Gallium Nitride GaN;
wherein the electronic component includes two side zones located on either side of the respective p-type doped GaN layer of each active stack, the two side zones being oxygen-implanted,
wherein each active stack includes:
an n-type doped GaN layer disposed on the p-type doped GaN layer;
an unintentionally doped GaN layer disposed on the n-type doped GaN layer; and
a semiconductor layer disposed on the unintentionally doped GaN layer to form a two-dimensional electron gas;

the component further including a source zone, a drain zone and a control gate zone formed on or in the semiconductor layer to form a two-dimensional electron gas;

the two oxygen-implanted side zones also extending on either side of the n-type doped GaN layer, of the unintentionally doped GaN layer and of the semiconductor layer to form a two-dimensional electron gas.

8. The electronic component according to claim 7, wherein acceptors of the p-type doped Gallium Nitride GaN layer are Magnesium atoms.

9. The electronic component according to claim 8, wherein a width of each active stack and a width of each of the oxygen-implanted zones are less than or equal to 20 μm and greater than or equal to 1 μm, the width being measured parallel to the plane of the layers in line with each active stack and the oxygen-implanted zones.

10. The electronic component according to claim 7, wherein each active stack includes:

an n-type doped GaN layer disposed on the p-type doped GaN layer;

an unintentionally doped GaN layer disposed on the n-type doped GaN layer;

a semiconductor layer disposed on the unintentionally doped GaN layer to form a two-dimensional electron gas;

two oxygen-implanted side zones extending on either side of the p-type doped GaN layer, of the n-type doped GaN layer, of the unintentionally doped GaN layer and of the semiconductor layer to form a two-dimensional electron gas the source, drain and control gate zones being common to the plurality of active stacks;

each active stack being electrically insulated from the adjacent active stack by one of the oxygen-implanted side zones.

11. The electronic component according to claim 10, wherein the plurality of said stacks is surrounded by an insulation zone, said insulation zone being an oxygen-implanted zone.

12. The electronic component according to claim 7, wherein each of the two oxygen-implanted side zones extends in or under the gate zone and in or under the drain zone and the source zone.

13. The electronic component according to claim 7, wherein each of the two oxygen-implanted side zones extends in or under the gate zone and does not extend in or under the drain zone and the source zone.

14. A method for manufacturing an electronic component including a substrate a plurality of active stacks, each active stack being formed above the substrate and including:

a layer of p-type doped Gallium Nitride GaN disposed above the substrate;

a layer of a semiconductor material disposed on the layer of p-type doped Gallium Nitride GaN;

wherein the electronic component includes two side zones located on either side of the respective p-type doped GaN layer of each active stack, the two side zones being oxygen-implanted, the method comprising:

making on the substrate the plurality of active stacks formed above the substrate, each active stack including:

the layer of p-type doped Gallium Nitride GaN, disposed above the substrate;

the layer of a semiconductor material disposed on the p-type doped Gallium Nitride GaN layer;

making a mask above the plurality of stacks, said mask masking each active stack;

ion implantation to introduce oxygen atoms into the two zones of each active stack located on either side of the masked zone so as to obtain two oxygen-implanted side zones in the p-type doped Gallium Nitride GaN layer;

annealing following ion implantation, wherein a dose of oxygen atoms implanted is:

greater than $2 \cdot 10^{14}$ cm$^{-2}$×(Wa/Wo) where Wa denotes a width of the active stack and Wo denotes a width of the implanted side zones and;

less than $6 \cdot 10^{15}$ cm$^{-2}$×(Wa/Wo), the width being measured parallel to the plane of the layers in line with each active stack and the oxygen-implanted zones.

15. The method according to claim 14, wherein an annealing temperature is between 70° and 850° C.

16. The method according to claim 14, wherein the implantation is a multi-energy implantation.

17. The method according to claim 14, wherein an energy of the ionised oxygen atoms used for implantation is less than or equal to 200 keV.

18. The method according to claim 14, wherein the ion implantation step for introducing oxygen atoms is accompanied with an ion implantation step for introducing argon or nitrogen atoms.

\* \* \* \* \*